(12) United States Patent
Johnson et al.

(10) Patent No.: US 7,920,612 B2
(45) Date of Patent: Apr. 5, 2011

(54) LIGHT EMITTING SEMICONDUCTOR DEVICE HAVING AN ELECTRICAL CONFINEMENT BARRIER NEAR THE ACTIVE REGION

(75) Inventors: Ralph H. Johnson, Murphy, TX (US);
James R. Biard, Richardson, TX (US);
James K. Guenter, Garland, TX (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/461,353

(22) Filed: Jul. 31, 2006

(65) Prior Publication Data

US 2006/0268954 A1    Nov. 30, 2006

Related U.S. Application Data

(63) Continuation-in-part of application No. 11/091,656, filed on Mar. 28, 2005, now Pat. No. 7,596,165.

(60) Provisional application No. 60/605,737, filed on Aug. 31, 2004.

(51) Int. Cl.
*H01S 5/00* (2006.01)
*H01S 5/183* (2006.01)
*H01S 5/323* (2006.01)

(52) U.S. Cl. ................. 372/45.01; 372/50.124

(58) Field of Classification Search .............. 372/45.01, 372/50.124
See application file for complete search history.

(56) References Cited

U.S. PATENT DOCUMENTS

| | | |
|---|---|---|
| 4,317,085 A | 2/1982 | Brunham et al. |
| 4,466,694 A | 8/1984 | MacDonald |
| 4,660,207 A | 4/1987 | Svilans |
| 4,675,058 A | 6/1987 | Plaster |
| 4,784,722 A | 11/1988 | Liau et al. |
| 4,882,734 A | 11/1989 | Scifres |
| 4,885,592 A | 12/1989 | Kofol et al. |
| 4,901,327 A | 2/1990 | Bradley |
| 4,943,970 A | 7/1990 | Bradley |
| 4,956,844 A | 9/1990 | Goodhue et al. |
| 5,031,187 A | 7/1991 | Orenstein et al. |
| 5,052,016 A | 9/1991 | Mahbobzadeh |
| 5,056,098 A | 10/1991 | Anthony et al. |
| 5,062,115 A | 10/1991 | Thornton |
| 5,068,869 A | 11/1991 | Wang et al. |
| 5,079,774 A | 1/1992 | Mendez et al. |
| 5,115,442 A | 5/1992 | Lee et al. |

(Continued)

OTHER PUBLICATIONS

Chang et al., "Theoretical and Experimental Analysis on InAlGaAs/AlGaAs Active Region of 850-nm Vertical-Cavity Surface-Emitting Lasers," Journal of Lightwave Technology, vol. 24, No. 1, Jan. 2006.

(Continued)

*Primary Examiner* — Minsun Harvey
*Assistant Examiner* — Michael Carter
(74) *Attorney, Agent, or Firm* — Maschoff Gilmore & Israelsen

(57) ABSTRACT

Light emitting semiconductor devices such as VCSELs, SELs, and LEDs are manufactured to have a thin electrical confinement barrier in a confining layer near the active region of the device. The thin confinement barrier comprises a III-V semiconductor material having a high aluminum content (e.g. 80%-100% of the type III material). The aluminum content of the adjacent spacer layer is lower than that of the confinement barrier. In one embodiment the spacer layer has an aluminum content of less than 40% and a direct bandgap. The aluminum profile reduces series resistance and improves the efficiency of the semiconductor device.

26 Claims, 5 Drawing Sheets

U.S. PATENT DOCUMENTS

| | | | |
|---|---|---|---|
| 5,117,469 A | 5/1992 | Cheung et al. | |
| 5,140,605 A | 8/1992 | Paoli et al. | |
| 5,157,537 A | 10/1992 | Rosenblatt et al. | |
| 5,158,908 A | 10/1992 | Blonder et al. | |
| 5,216,263 A | 6/1993 | Paoli | |
| 5,216,680 A | 6/1993 | Magnusson et al. | |
| 5,237,581 A | 8/1993 | Asada et al. | |
| 5,245,622 A | 9/1993 | Jewell et al. | |
| 5,258,990 A | 11/1993 | Olbright et al. | |
| 5,262,360 A | 11/1993 | Holonyak, Jr. et al. | |
| 5,285,466 A | 2/1994 | Tabatabaie | |
| 5,293,392 A | 3/1994 | Shieh et al. | |
| 5,317,170 A | 5/1994 | Paoli | |
| 5,317,587 A | 5/1994 | Ackley et al. | |
| 5,319,660 A | 6/1994 | Chen et al. | |
| 5,325,386 A | 6/1994 | Jewell et al. | |
| 5,331,654 A | 7/1994 | Jewell et al. | |
| 5,331,655 A * | 7/1994 | Harder et al. | 372/45.01 |
| 5,337,074 A | 8/1994 | Thornton | |
| 5,337,183 A | 8/1994 | Rosenblatt et al. | |
| 5,349,599 A | 9/1994 | Larkins | |
| 5,351,256 A | 9/1994 | Schneider et al. | |
| 5,359,447 A | 10/1994 | Hahn et al. | |
| 5,359,618 A | 10/1994 | Lebby et al. | |
| 5,363,397 A | 11/1994 | Collins et al. | |
| 5,373,520 A | 12/1994 | Shoji et al. | |
| 5,373,522 A | 12/1994 | Holonyak, Jr. et al. | |
| 5,386,426 A | 1/1995 | Stephens | |
| 5,390,209 A | 2/1995 | Vakhshoori | |
| 5,396,508 A | 3/1995 | Bour et al. | |
| 5,404,373 A | 4/1995 | Cheng | |
| 5,412,678 A | 5/1995 | Treat et al. | |
| 5,412,680 A | 5/1995 | Swirhum et al. | |
| 5,416,044 A | 5/1995 | Chino et al. | |
| 5,428,634 A | 6/1995 | Bryan et al. | |
| 5,438,584 A | 8/1995 | Paoli et al. | |
| 5,446,754 A | 8/1995 | Jewell et al. | |
| 5,465,263 A | 11/1995 | Bour et al. | |
| 5,475,701 A | 12/1995 | Hibbs-Brenner | |
| 5,493,577 A | 2/1996 | Choquette et al. | |
| 5,497,390 A | 3/1996 | Tanaka et al. | |
| 5,513,202 A | 4/1996 | Kobayashi et al. | |
| 5,530,715 A | 6/1996 | Shieh et al. | |
| 5,555,255 A | 9/1996 | Kock et al. | |
| 5,557,626 A | 9/1996 | Grodinski et al. | |
| 5,561,683 A | 10/1996 | Kwon | |
| 5,567,980 A | 10/1996 | Holonyak, Jr. et al. | |
| 5,568,499 A | 10/1996 | Lear | |
| 5,574,738 A | 11/1996 | Morgan | |
| 5,574,744 A | 11/1996 | Gaw et al. | |
| 5,581,571 A | 12/1996 | Holonyak, Jr. et al. | |
| 5,586,131 A | 12/1996 | Ono et al. | |
| 5,590,145 A | 12/1996 | Nitta | |
| 5,598,300 A | 1/1997 | Magnusson et al. | |
| 5,606,572 A | 2/1997 | Swirhun et al. | |
| 5,625,729 A | 4/1997 | Brown | |
| 5,642,376 A | 6/1997 | Olbright et al. | |
| 5,645,462 A | 7/1997 | Banno et al. | |
| 5,646,978 A | 7/1997 | Klem et al. | |
| 5,648,978 A | 7/1997 | Sakata | |
| 5,696,023 A | 12/1997 | Holonyak, Jr. et al. | |
| 5,699,373 A | 12/1997 | Uchida et al. | |
| 5,712,188 A | 1/1998 | Chu et al. | |
| 5,724,374 A | 3/1998 | Jewell | |
| 5,726,805 A | 3/1998 | Kaushik et al. | |
| 5,727,013 A | 3/1998 | Botez et al. | |
| 5,727,014 A | 3/1998 | Wang et al. | |
| 5,745,515 A * | 4/1998 | Marta et al. | 372/45.013 |
| 5,774,487 A | 6/1998 | Morgan | |
| 5,778,018 A | 7/1998 | Yoshikawa et al. | |
| 5,784,399 A | 7/1998 | Sun | |
| 5,818,066 A | 10/1998 | Duboz | |
| 5,828,684 A | 10/1998 | Van de Walle | |
| 5,838,705 A | 11/1998 | Shieh et al. | |
| 5,838,715 A | 11/1998 | Corzine et al. | |
| 5,896,408 A | 4/1999 | Corzine et al. | |
| 5,901,166 A | 5/1999 | Nitta et al. | |
| 5,903,588 A | 5/1999 | Guenter et al. | |
| 5,903,589 A | 5/1999 | Jewell | |
| 5,903,590 A | 5/1999 | Hadley et al. | |
| 5,908,408 A | 6/1999 | McGary et al. | |
| 5,940,422 A | 8/1999 | Johnson | |
| 5,953,362 A | 9/1999 | Pamulapati et al. | |
| 5,959,307 A * | 9/1999 | Nakamura et al. | 257/14 |
| 5,978,401 A | 11/1999 | Morgan | |
| 5,978,408 A | 11/1999 | Thornton | |
| 5,995,531 A | 11/1999 | Gaw et al. | |
| 6,002,705 A | 12/1999 | Thornton | |
| 6,008,675 A | 12/1999 | Handa | |
| 6,014,395 A | 1/2000 | Jewell | |
| 6,043,104 A | 3/2000 | Uchida et al. | |
| 6,055,262 A | 4/2000 | Cox et al. | |
| 6,078,601 A | 6/2000 | Smith | |
| 6,144,682 A | 11/2000 | Sun | |
| 6,154,480 A | 11/2000 | Magnusson et al. | |
| 6,185,241 B1 | 2/2001 | Sun | |
| 6,191,890 B1 | 2/2001 | Baets et al. | |
| 6,208,681 B1 | 3/2001 | Thornton | |
| 6,212,312 B1 | 4/2001 | Grann et al. | |
| 6,238,944 B1 | 5/2001 | Floyd | |
| 6,266,357 B1 | 7/2001 | Feld et al. | |
| 6,269,109 B1 | 7/2001 | Jewell | |
| 6,297,068 B1 | 10/2001 | Thornton | |
| 6,317,446 B1 | 11/2001 | Wipiejewski | |
| 6,320,893 B1 | 11/2001 | Ueki | |
| 6,372,533 B2 | 4/2002 | Jayaraman et al. | |
| 6,411,638 B1 | 6/2002 | Johnson et al. | |
| 6,459,713 B2 | 10/2002 | Jewell | |
| 6,545,335 B1 | 4/2003 | Chua et al. | |
| 6,570,905 B1 * | 5/2003 | Ebeling | 372/96 |
| 6,628,694 B2 | 9/2003 | Deng et al. | |
| 6,700,914 B2 | 3/2004 | Yokouchi et al. | |
| 6,727,520 B2 | 4/2004 | Morgan et al. | |
| 6,782,027 B2 | 8/2004 | Cox et al. | |
| 6,829,283 B2 | 12/2004 | Ebeling | |
| 6,990,135 B2 | 1/2006 | Johnson et al. | |
| 7,026,653 B2 | 4/2006 | Sun | |
| 7,065,124 B2 | 6/2006 | Biard et al. | |
| 7,251,264 B2 | 7/2007 | Johnson et al. | |
| 7,596,165 B2 | 9/2009 | Johnson | |
| 2001/0043629 A1 | 11/2001 | Sun et al. | |
| 2001/0050934 A1 | 12/2001 | Choquette et al. | |
| 2002/0101899 A1 * | 8/2002 | Yokouchi et al. | 372/46 |
| 2002/0154675 A1 | 10/2002 | Deng et al. | |
| 2003/0123513 A1 | 7/2003 | Villareal | |
| 2003/0123514 A1 * | 7/2003 | Cox et al. | 372/96 |
| 2004/0081215 A1 | 4/2004 | Johnson | |
| 2004/0104404 A1 * | 6/2004 | Bito | 257/192 |
| 2005/0031011 A1 * | 2/2005 | Biard et al. | 372/99 |
| 2005/0127391 A1 | 6/2005 | Yamamoto | |
| 2006/0268954 A1 | 11/2006 | Johnson et al. | |
| 2009/0115346 A1 | 5/2009 | Walter | |

OTHER PUBLICATIONS

Chang et al., "The Carrier Blocking Effect on 850 nm InAlGaAs/AlGaAs Vertical-Cavity Surface-Emitting Lasers," Institute of Physics Publishing, Semiconductor Science and Technology, 21, (2006), pp. 1488-1494.
U.S. Appl. No. 11/735,993, Sep. 17, 2008, Restriction Requirement.
U.S. Appl. No. 11/735,993, Feb. 20, 2009, Restriction Requirement.
U.S. Appl. No. 11/735,993, May 29, 2009, Office Action.
U.S. Appl. No. 11/735,993, Jan. 7, 2010, Final Office Action.
U.S. Appl. No. 11/735,993, Mar. 11, 2010, Notice of Allowance.

* cited by examiner

LIGHT EMITTING SEMICONDUCTOR DEVICE HAVING AN ELECTRICAL CONFINEMENT BARRIER NEAR THE ACTIVE REGION

CROSS-REFERENCE TO RELATED APPLICATIONS

This application is a continuation-in-part of U.S. patent application Ser. No. 11/091,656, filed on Mar. 28, 2005, entitled "Distributed Bragg Reflector for Optoelectronic Device," which application claims the benefit of U.S. Provisional Application Ser. No. 60/605,737, filed Aug. 31, 2004. The foregoing applications are incorporated herein by reference.

BACKGROUND OF THE INVENTION

1. Field of the Invention

The invention generally relates to light emitting semiconductor devices such as semiconductor lasers and light emitting diodes. More specifically, the invention relates to confinement of a free carrier in the active region of the semiconductor device.

2. Related Technology

Vertical-Cavity Surface-Emitting Lasers (VCSELs), Surface Emitting Lasers (SELs) and Light Emitting Diodes (LEDs) are becoming increasingly important for a wide variety of applications including optical interconnection of integrated circuits, optical computing systems, optical recording and readout systems, and telecommunications.

VCSELs, SELs, and LEDs are generally formed as a semiconductor diode. A diode is formed from a junction between a p-type material and an n-type material. In VCSELs, the p-type semiconductor material is most often aluminum gallium arsenide (AlGaAs) doped with a material such as carbon that introduces free holes or positive charge carriers, while the n-type semiconductor materials is typically AlGaAs doped with a material such as silicon that introduces free electrons, or negative charge carriers.

The PN junction forms an active region. The active region typically includes a number of quantum wells. Free carriers in the form of holes and electrons are injected into the quantum wells when the PN junction is forward biased by an electrical current. At a sufficiently high bias current the injected minority carriers form a population inversion in the quantum wells that produces optical gain which is used inside a resonant cavity to cause lasing in semiconductor lasers such as VCSELs.

Free carriers that escape the quantum wells into the surrounding semiconductor and recombine there do not contribute to the optical gain and are parasitic currents which generate heat and reduce the efficiency of the light emitting device. This "carrier leakage" is one of the causes of the rollover of the light vs current curve. Current can only be increased so much and then light output reaches a maximum and drops off. Generally, higher temperatures result in lower maximum light output partially because the thermal energy of the carriers, electrons and holes, is increased allowing a larger fraction to contribute to carrier leakage. Electrical confinement in the active region can be particularly problematic in VCSEL devices, which tend to require high current densities for operation and is made worse in the highest frequency VCSELs where the highest current densities are used.

BRIEF SUMMARY OF THE INVENTION

The present invention relates to light emitting semiconductor devices such as VCSELs, SELs, and LEDs having a thin electrical confinement barrier in a confining layer near the active region of the device. The thin confinement barrier comprises a III-V semiconductor material having a high aluminum content (e.g 80%-100% of the type III material).

The confinement barrier is sandwiched between the active region and a spacer layer. The aluminum content in the confinement barrier is higher than the aluminum content in the spacer layer such that a narrow spike in aluminum content is formed. The aluminum spike increases the band gap of the electrical confinement barrier, thereby increasing the confinement of the electrons and holes in the active region. The confinement barrier allows the aluminum content in the spacer layer to be lowered (e.g., to less than 40%) while maintaining or improving the confinement of free carriers in the active region. The lower aluminum content in the spacer layer increases the thermal conductivity, increases the electron and hole mobility, and thereby reduces the electrical resistance and the thermal impedance of the semiconductor device improving efficiency.

The confinement barrier is made very thin (e.g., between 5 and 30 nm thick). The thinness of the confinement barrier minimizes vertical resistance and improves the manufacturability of the epitaxial structure. High aluminum content material typically requires higher temperatures for crystal growth. The higher temperatures can be difficult to work with and can degrade other semiconductor layers or cause imperfections in the crystal lattice. By making the confining layer thin, many of these problems are avoided or minimized.

In an exemplary embodiment, the confining layer also includes a doping increase. The confinement layer is doped with a p-type or n-type dopant depending on whether the confinement barrier is on the n-side or p-side of the active region. An increase in the dopant in the confinement barrier can advantageously improve carrier confinement in the device and increase the efficiency of the device at high temperatures or high current densities.

The features of the confining layers in the devices of the present invention improve confinement of free carriers in the active region. This improved confinement leads to a higher percentage of the carriers recombining in the quantum wells where they provide the desired optical emission or optical gain. Devices including the thin confining layers according to the present invention also show improvements in thermal conductivity and electrical resistance because of the ability to use more thermally and electrically conductive low Al spacers and because the high Al confining layers are also higher thermal conductivity and mobility than intermediate compositions.

These and other advantages and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings, in which.

DETAILED DESCRIPTION OF EXEMPLARY EMBODIMENTS

The present invention relates to light emitting semiconductor devices such as VCSELs, SELs, and LEDs having a thin electrical confining layer near the active region of the device. Various aspects of the present invention will now be illustrated in the context of a VCSEL. However, those skilled in the art will recognize that the features of the present invention can be incorporated into other light emitting semiconductor devices that have an active region.

Figure 1:
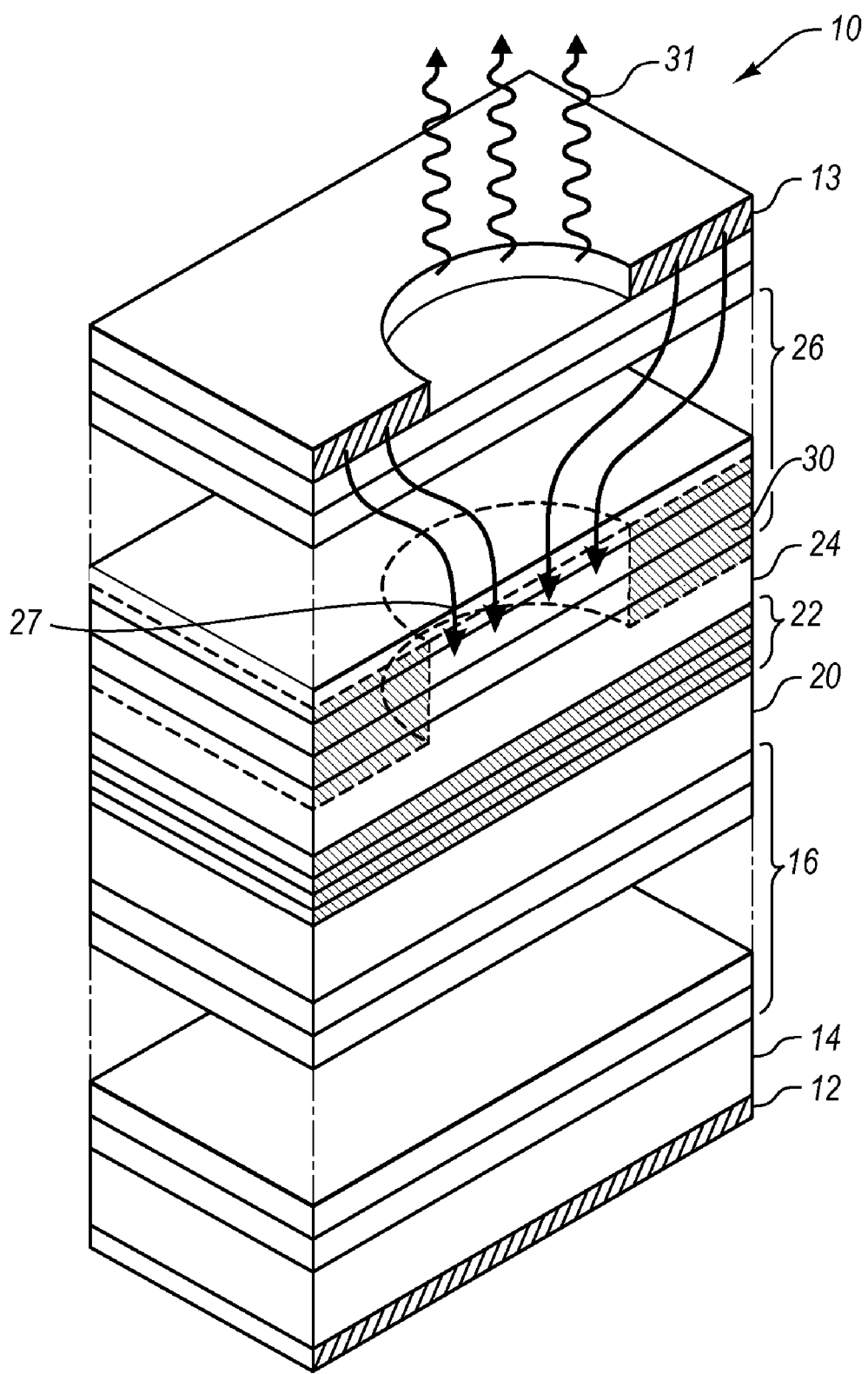
FIG. 1 is an illustration of an exemplary vertical cavity surface emitting laser according to the present invention.

FIG. 1 shows a planar, current-guided, vertical cavity surface emitting laser (VCSEL) 10 having periodic layer pairs for top and bottom Bragg mirrors. A substrate 14 is formed on a bottom contact 12 and is doped with a first type of impurities (i.e. p-type or n-type dopant). A bottom mirror stack 16 is formed on substrate 14 and a bottom confining layer 20 is formed on bottom stack 16. The bottom confining layer 20 and a top confining layer 24 sandwich an active region 22. An upper mirror stack 26 is formed on the top confining layer 24. A metal layer 13 forms a contact on a portion of stack 26.

An isolation region 30 restricts the area of the current flow 27 through the active region 22. Region 30 can be formed by an ion implantation and/or oxidation.

Figure 5:
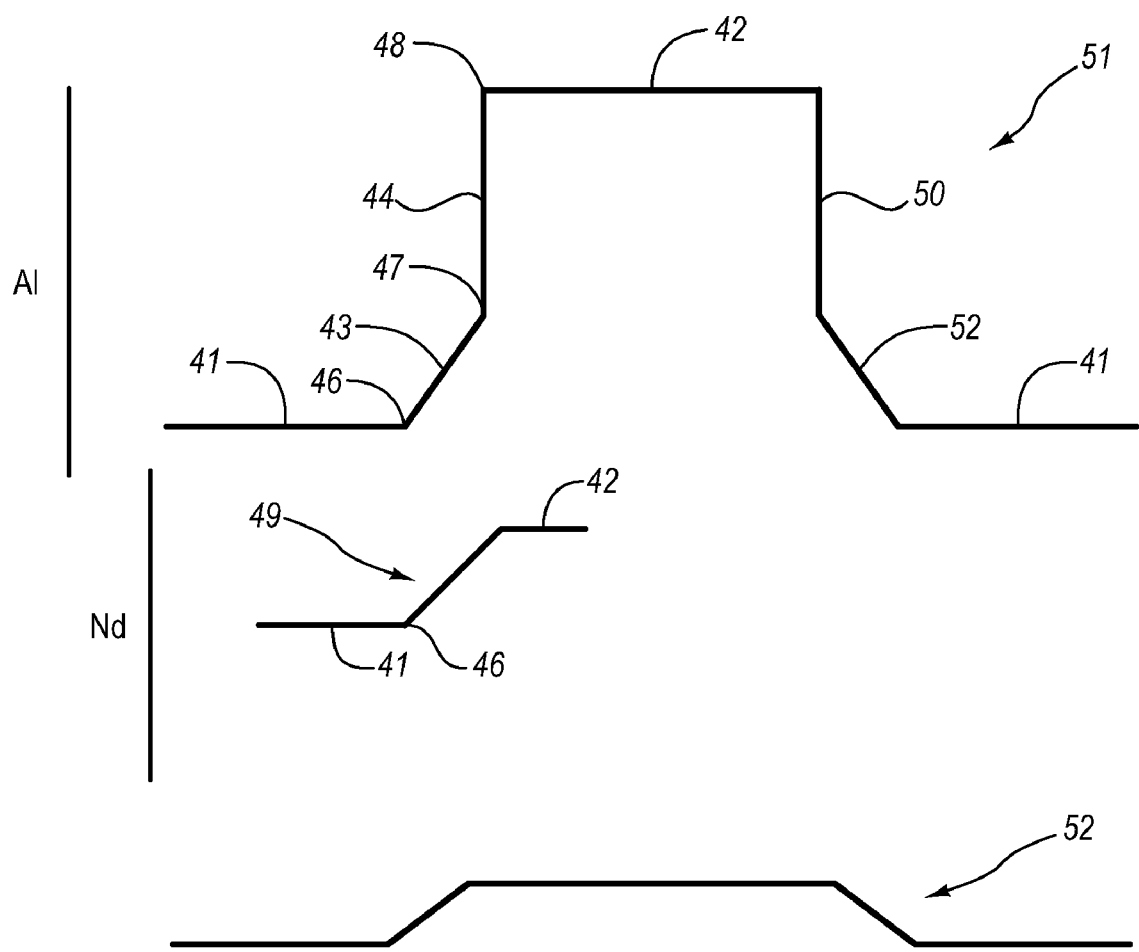
FIG. 5 reveals transition ramps of composition change from one layer to another of a distributed Bragg period of a VCSEL mirror.

Stacks 16 and 26 can be distributed Bragg reflector (DBR) stacks, and include periodic layers 41 and 42 (FIG. 5). Periodic layers 41 and 42 are typically AlGaAs and AlAs, respectively, but can be made from other III-V semiconductor materials. Stacks 16 and 26 can be doped or undoped and the doping can be n-type or p-type depending on the particular VCSEL design. Various portions of the present discussion may refer to several configurations of the VCSEL.

Metal contact layers 12 and 13 can be ohmic contacts that allow appropriate electrical biasing of laser diode 10. When VCSEL 10 is forward biased with a voltage on contact 13 different than the one on contact 12, active region 22 emits light 32 which passes through stack 26.

Figure 2:
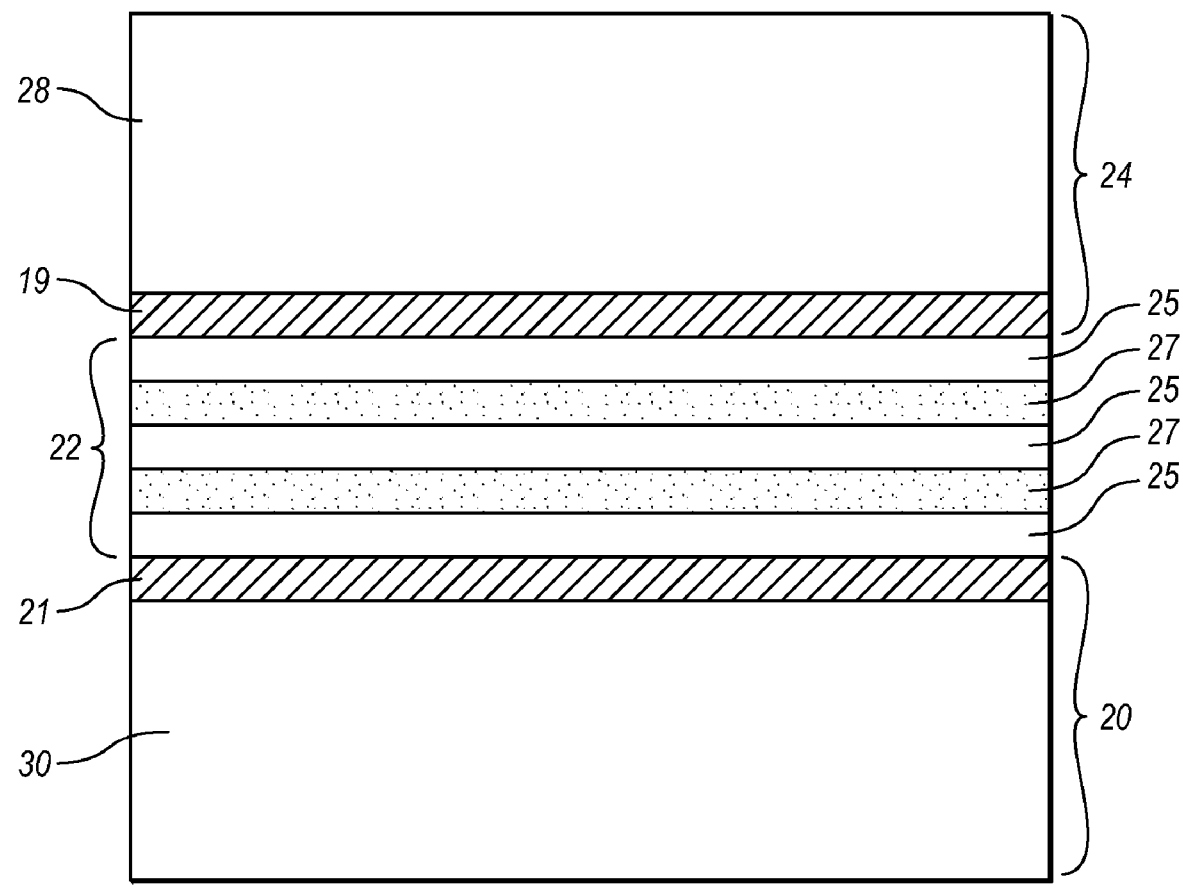
FIG. 2 illustrates the confining layers and active region of the laser of FIG. 1 in more detail.

FIG. 2 illustrates the active region 22 and confining layers 20 and 24. In an exemplary embodiment, the active region 22 is formed from a plurality of quantum wells 27 that are separated by quantum well barriers 25. Confining layer 24 includes a spacer layer 28 and a confinement barrier 19. The confinement barrier 19 is sandwiched between the active region 22 and spacer layer 28. Alternatively or in addition to confinement barrier 19, a confining layer 20 includes a confinement barrier 21 adjacent a spacer layer 30. The confinement barrier 21 is sandwiched between the active region 22 and spacer layer 30.

The thickness of the quantum well layers 27 and quantum well barriers 25 depends on the particular configuration of the light emitting device. In an exemplary embodiment, the quantum well layers 27 and the quantum well barriers 25 have a thickness in a range from about 50 Angstroms to about 100 Angstroms.

The confining layer thickness is dependent upon the kind of device being fabricated. In a vertical cavity resonant device such as a VCSEL, or VECSEL it provides for resonant spacing between mirrors and provides that the quantum wells of the active region are centered on a peak of the optical field.

In one aspect of the invention the thickness of the one or more confinement barriers is limited to minimize the vertical resistance and facilitate the manufacturability of the device. In a preferred embodiment, the thickness of confinement barrier is less than about 50 nm and more preferably about 20 nm. Even more preferably the thickness of the confining layer is in a range from about 2 nm to about 50 nm, more preferably in a range from about 5 nm to about 30 nm, and most preferably between 8 nm and 30 nm. Another measurement for limiting the thickness of the confining layer is its thickness relative to the spacer layer. In a preferred embodiment the confinement barrier has a thickness that is less than 20% of the total thickness of the spacer layer.

The confining layers and active region are formed from one or more types of III-V semiconductor materials or the like. Suitable semiconductor materials include GaAs, AlAs, InP, AlGaAs, InGaAs, InAlAs, InGaP, AlGaAsP, AlGaInP, InGaAsP, InAlGaAs, or the like. In a preferred embodiment, the semiconductor material is $Al_xGa_{1-x}As$, where x is between 0.0 and 1.0 (i.e. aluminum is 0.0% to 100%). $Al_xGa_{1-x}As$ is particularly useful for making 850 nm VCSELs, which require high current densities and high optical output.

The shape of the transitions between compositions are an important variable. In general, however, transitions can be made in a wide variety of shapes including steps, linear ramps, parabolic ramps and more complex ramps. Because a given electron affinity may occur for 2 compositions, steps between compositions in n-type material can be used between 2 different compositions which have similar electron affinities.

Figure 3:
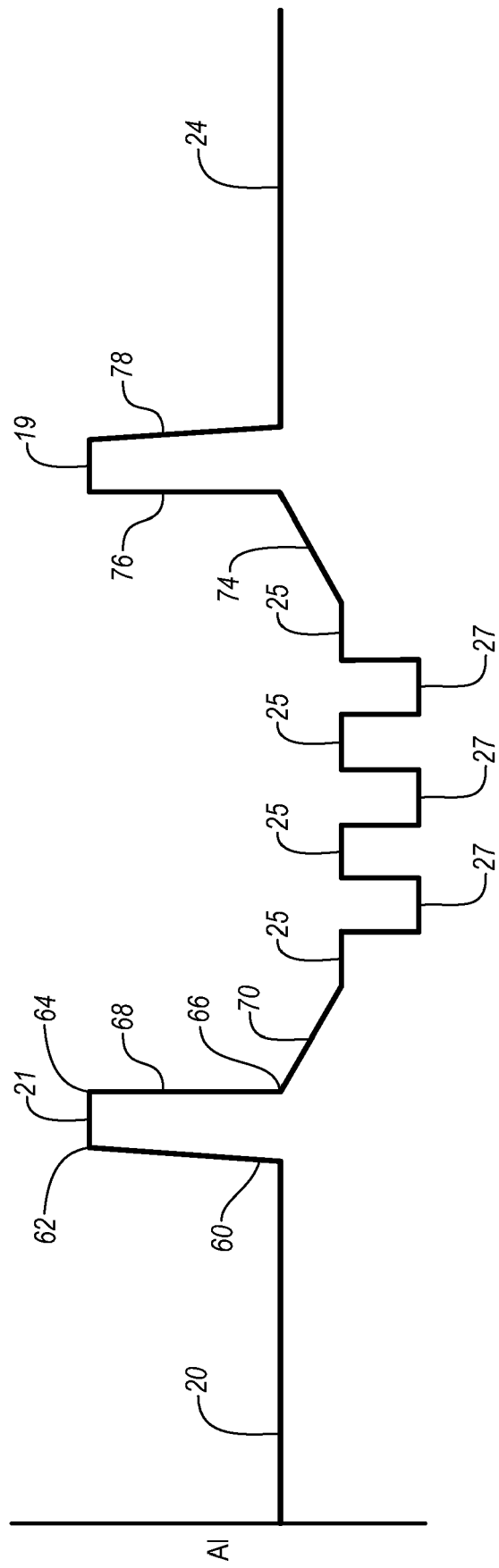
FIG. 3 is a diagram of the aluminum profile of an exemplary device according to the present invention.

The confinement barriers are created by varying the aluminum content in the confining layer. FIG. 3 is an example that may be used to form confinement barriers above and below an active region. Spacer layer 20 has a composition of $Al_zGa_{1-z}As$. The confinement barrier 21 begins at point 60 with a with a transition to point 62 with a change of composition from $Al_zGa_{1-z}As$ to $Al_yGa_{1-y}As$. From point 64 to point 66 is a transition 68 of composition from $Al_yGa_{1-y}As$ to $Al_wGa_{1-w}As$. Between point 66 and point 70 is a transition 72 from $Al_wGa_{1-w}As$ to $Al_vGa_{1-v}As$, which may be the composition of barrier 25 of quantum well 27. Similar transitions are performed in reverse order to form confining layer 24, thereby creating transition 74, transition 76, and transition 78. The values of y, z, w, and v may be values selected from a range from 0.0 to 1.0 for a desired design anywhere between 0.0 and 1.0.

In a preferred embodiment spacer layers 20 and 24 have an aluminum content in a range from about 12% to about 65% (i.e., z is in a range from about 0.12 to about 0.65), more preferably from about 15% to about 45% (z≈0.15 to 0.45). The aluminum content in the active region is typically between 0% and about 50%. The quantum well barriers preferably have an aluminum content in a range from 15% to about 50% (w≈0.15 to 0.50) and the quantum wells preferably have less than 15% aluminum, most preferably about 0% aluminum.

In a preferred embodiment, the aluminum content in the confinement barrier is in a range from about 60% to about 100% (y≈0.60 to 1.0), more preferably between about 70% and 100% (y≈0.70 to 1.0). For oxide confined lasers it can be advantageous to have an aluminum content in the confinement barrier that is less than 100% to avoid undesired oxidation. In this embodiment, the aluminum content in the confinement barrier is preferably less than about 85% (e.g. between 60% and 85%).

In one embodiment, the confinement barriers can be described according to the differential in aluminum content between the confinement barrier and the adjacent spacer layer. In a preferred embodiment, the percentage of aluminum content in the confining layer is greater by at least about 15%, more preferably greater by at least about 20%, and most preferably greater by at least about 25% (e.g. the spacer layer has 40% Al and the confinement barrier has 65% Al).

In one embodiment of the present invention, the confinement barriers 19 and 21 can include a doping spike in addition to the aluminum spike. The doping spike in the confinement barrier is preferably in a range from about $5 \times 10^{17}$ to about $1 \times 10^{19}$ on the bottom or n-side of the active region and preferably in a range from about $5 \times 10^{17}$ to about $6 \times 10^{18}$ in the confinement barrier on the upper or p-side of the active region. Most preferably the doping in either confinement barrier is in a range from about $1 \times 10^{18}$ to about $3 \times 10^{18}$. Similar to the aluminum spike, the doping spike in the confinement barrier is selected relative to the dopant level in the spacer layer. In an exemplary embodiment, the dopant level in the spacer layer is in a range from about $1 \times 10^{17}$ to about $1 \times 10^{18}$. In a preferred embodiment, the dopant in the confinement barriers is between about 1.5 and 8 times greater than in the spacer layers, more preferably between about 1.5 and 4 times greater than in the spacer layer.

The confinement barriers 19 and 21 advantageously provide confinement for free carriers in the active region. Barrier 19 and 21 can have the same or different peak levels of aluminum. Furthermore, device 10 can benefit from having just one confinement barrier either above or below the active region; however it is typically preferred to provide an n-side confinement barrier and a p-side confinement barrier.

The confinement barrier can be particularly advantageous for device operation at high temperature and/or high bias currents where minority carrier confinement may be lost. Loss of confinement is undesirable because it decreases the efficiency of the light emitting semiconductor device. With n-doping in the confinement barrier layer, the full bandgap of AlAs or similar material may be extended into the valence band. A confinement barrier layer thickness of 2 nm to 20 nm, more preferably 8 nm to 10 nm should be sufficient to confine the minority carriers. Thus, the minority carriers injected into the quantum well region may be contained in that region by the presence of the confinement barrier (i.e. a hole barrier confines holes and an electron barrier confines electrons). The loss of free carrier confinement can be dramatically reduced or even eliminated.

The Al.65Ga.35As alloy normally used in the spacer layer provides a large barrier to free carriers in the valence band which ensures good confinement at high bias levels and high temperature, but has an undesirable indirect bandgap. This gives relatively low electron mobility and high vertical series resistance for a given doping level in the n-spacer.

In an exemplary embodiment of the present invention, the one or more spacer layers can have an aluminum composition less than 45% (e.g. 0.389 or 0.328), which can benefit the device in several ways. First, the graded region between the Bragg mirror and spacer can be replaced with a step in composition to an alloy with the same electron affinity as the mirror layer. This reduces the barrier to electron flow found in previous designs using the linear grade in aluminum composition and result in a reduction in series resistance. The spacer layer can then be a direct bandgap semiconductor. The scattering of majority carriers from the indirect X conduction band to the direct Γ conduction band now occurs at the Bragg mirror rather than near the quantum wells. This can eliminate the risetime limitation associated with having that transition near the quantum wells.

Second the fact that the spacer is a direct bandgap material gives it a much higher electron mobility. Therefore, a given series resistance can be obtained with a much lower donor doping concentration. This reduces the free carrier absorption close to the quantum wells where the E-field standing wave has the highest amplitude. Decreased free carrier absorption can improve the efficiency of the VCSEL. Third, with the direct bandgap spacer, the ramp from e.g. 0.389 or 0.328 aluminum fraction to the 0.25 aluminum fraction in the quantum well barrier layer is all direct bandgap and should not impose a speed limitation on the VCSEL. Fourth, using a step function in the Al fraction from the Bragg mirror layer to the direct band gap spacer with the same electron affinity avoids DX center range of Al fraction between 0.40 and 0.60.

Figure 4:
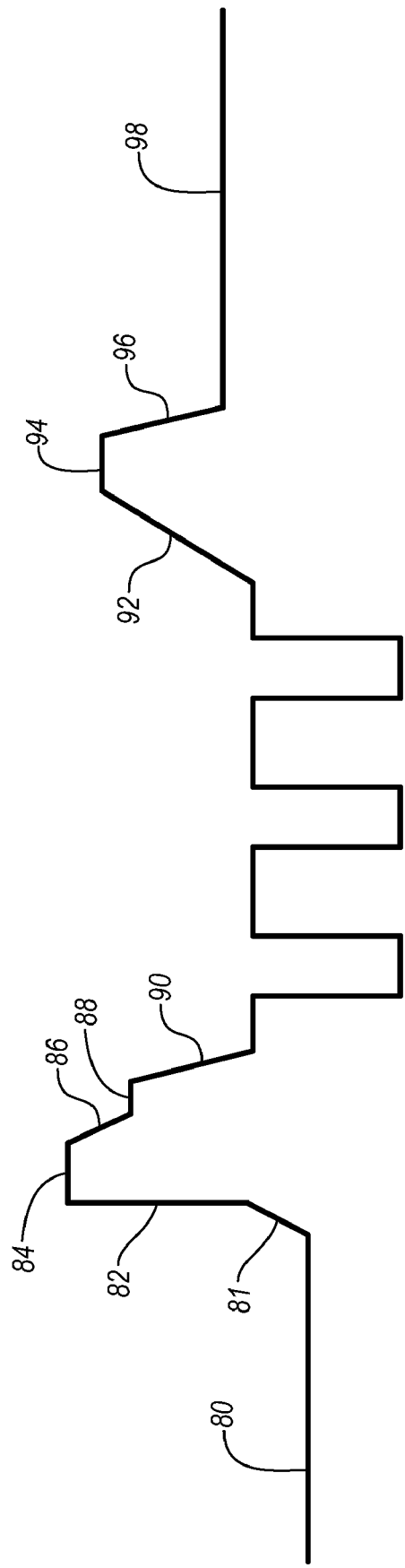
FIG. 4 is a diagram of the aluminum profile of another exemplary device according to the present invention.

FIG. 4 illustrates another exemplary embodiment. The lower spacer, 80, has an aluminum composition between 10 and 20% and is doped n-type at 2e16-5e17/cm3. The lower spacer is followed by a linear ramp 81 to 25% where the doping is ramped from that of the spacer to about 2e18/cm3 n-type with a linear ramp which is about 10 nm thick. This is followed by a step at 82 to about 85%. The 85% layer 84 is doped about 2e18/cm3 n type and has a thickness between 12 and 25 nm. This is followed by a linear ramp 86 in composition to about 65% which is 5 nm with a doping of 2e18/cm3 n-type. This is followed by a 10 nm region 88 of 65% which is n doped at 2e18. This is followed by an undoped linear ramp 90 with a length of 15 nm from 65% to 25%. This is followed by the quantum well active region with quantum wells and barriers. The p-side begins with a ~3e18 p-doped ramp 92 which is about 7.5 nm thick to a composition of 85%. The 85% layer 94 is from ~2e18 p doped and is about 20 nm thick. This is followed by a 20 nm ramp 96 at a doping starting at 2e18 ramping to about 5e17/cm3 with a final composition which matches the p-spacer 98. The p-spacer has a composition of between 10 and 20% and a doping of 5e17 p-type.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A light emitting semiconductor device comprising a III-V semiconductor material and having improved electrical confinement in the active region, comprising:
    an active region;
    an electrical confining layer positioned adjacent the active region, the confining layer comprising:
    a spacer layer comprising aluminum;
    a confinement barrier positioned between the spacer layer and the active region and having a thickness that is in a range from 2 nm to 50 nm, the confinement barrier having an aluminum content greater than that of the spacer layer, thereby creating a spike in the aluminum content near the active region, wherein the electrical confining layer comprises a dopant increase in the confinement barrier, the spacer layer comprising a direct bandgap material having an aluminum content of less than 45% and wherein the confinement barrier has an aluminum content greater than 60%.

2. A semiconductor device as in claim 1, wherein the aluminum content of the confinement barrier is greater than that of the spacer layer by between 10% and 40%.

3. A semiconductor device as in claim 1, wherein the aluminum content of the confinement barrier is greater than that of the spacer layer by greater than 40%.

4. A semiconductor device as in claim 1, wherein the aluminum content of the confinement barrier is greater than 80%.

5. A semiconductor device as in claim 1, wherein the thickness of the confinement barrier is in a range from 5 nm to 20 nm.

6. A semiconductor device as in claim 1, wherein the thickness of the confinement barrier is between 8 nm and 10 nm.

7. A semiconductor device as in claim 1, wherein the III-V semiconductor material comprises $Al_xGa_{1-x}As$, wherein x is between 0.0 and 1.0.

8. A semiconductor device as in claim 1, wherein the confining layer is on the upper side of the active region.

9. A semiconductor device as in claim 1, wherein the confining layer is on the bottom side of the active region.

10. A light emitting semiconductor device comprising a III-V semiconductor material and having improved electrical confinement in the active region, comprising:
an active region;
an electrical confining layer positioned adjacent the active region, the confining layer comprising, wherein the confining layer is on the bottom side of the active region:
a spacer layer comprising a direct bandgap material having an aluminum content less than 45% and greater than an aluminum content of the active region;
a confinement barrier positioned between the spacer layer and the active region and having a thickness that is in a range from 2 nm to 50 nm, the confinement barrier having an aluminum content greater than that of the spacer layer, thereby creating a spike in the aluminum content near the active region; and
a second confinement barrier within a confining layer on the upper side of the active region.

11. A semiconductor device having a confinement barrier to improve electron confinement in the active region, comprising:
a substrate; and
an epitaxial structure deposited on the substrate, the epitaxial structure comprising:
a bottom mirror and an upper mirror;
an active region between the bottom mirror and the upper mirror;
a confining layer comprising a III-V semiconductor material and being positioned adjacent the active region, the confining layer having,
a spacer layer comprising a direct bandgap material having an aluminum content less than 45% and greater than an aluminum content of the active region;
a confinement barrier positioned between the active region and the spacer layer, the confinement barrier having an aluminum content and a dopant level that is greater than that of the spacer layer, wherein the aluminum content of the confinement barrier is greater than 60%.

12. A semiconductor device as in claim 11, wherein the confinement barrier is on a bottom side of the active region.

13. A semiconductor device as in claim 12, wherein the dopant level is between $5\times10^{17}/cm^3$ to $6\times10^{18}/cm^3$ in the confinement barrier.

14. A semiconductor device as in claim 12, wherein the dopant level is between $1\times10^{18}/cm^3$ to $3\times10^{18}/cm^3$ in the confinement barrier.

15. A semiconductor device as in claim 11, wherein the confining layer is on an upper side of the active region.

16. A semiconductor device as in claim 15, wherein the dopant level is between $5\times10^{17}/cm^3$ to $1\times10^{19}/cm^3$ in the confinement barrier.

17. A semiconductor device as in claim 15, wherein the dopant level is between $1\times10^{18}/cm^3$ to $3\times10^{18}/cm^3$ in the confinement barrier.

18. A semiconductor device as in claim 11, wherein the aluminum content of the confinement barrier is greater than that of the spacer layer by between 10% and 40%.

19. A semiconductor device as in claim 11, wherein the aluminum content of the confinement barrier is greater than that of the spacer layer by greater than 40%.

20. A semiconductor device as in claim 11, wherein the confining layer is less than 20 nm thick.

21. A III-V semiconductor device having a confinement barrier to improve electron confinement in the active region, comprising:
a substrate; and
an epitaxial structure deposited on the substrate, the epitaxial structure comprising:
a bottom mirror and an upper mirror;
an active region between the bottom mirror and the upper mirror;
a first confining layer above the active region, the confining layer comprising a first confinement barrier, the first confinement barrier having a thickness in a range from 2 nm to 50 nm, an aluminum content in a range from 60% to 100%, and a dopant level in a range of $5\times10^{17}/cm^3$ to $6\times10^{18}/cm^3$, and wherein the aluminum content and dopant level of the first confinement barrier is greater than that of the material directly above the first confinement barrier and wherein the material directly above the first confinement barrier has an aluminum content less than 45% aluminum and greater than the active region, such that the material directly above the first confinement barrier is a direct bandgap material; and
a second confining layer below the active region, the second confining layer comprising a second confinement barrier, the confinement barrier having a thickness in a range from 2 nm to 50 nm, an aluminum content in a range from 60% to 100%, and a dopant level in a range of $5\times10^{17}/cm^3$ to $1\times10^{19}/cm^3$, and wherein the aluminum content and dopant level of the second confinement barrier is greater than that of the layer directly below the second confinement barrier and wherein the material directly below the second confinement barrier has an aluminum content less than 45% and greater than the active region, such that the material directly below the second confinement barrier is a direct bandgap material.

22. A semiconductor device as in claim 21, wherein the aluminum content of the first and second confinement barriers is greater than that of the material respectively above and below by at least 15%.

23. A semiconductor device as in claim 21, wherein the aluminum content of the first and second confinement barriers is greater than that of the material respectively above and below by at least 30%.

24. A semiconductor device as in claim 21, wherein the semiconductor device is an oxidized laser.

25. A semiconductor device as in claim 21, wherein the dopant level in the first and second confinement barriers is between $1\times10^{18}/cm^3$ to $3\times10^{18}/cm^3$.

26. A semiconductor device as in claim 11, where in the spacer layer is adjacent the upper mirror or the lower mirror and wherein the composition of the spacer layer has the same electron affinity as the composition of at least one layer of the adjacent upper mirror or lower mirror.

* * * * *